US011152938B2

United States Patent
Judkins, III et al.

(10) Patent No.: US 11,152,938 B2
(45) Date of Patent: Oct. 19, 2021

(54) MAGNETIC SWITCH WITH TOGGLE AND DE-BOUNCE FUNCTIONALITY

(71) Applicant: Allegro MicroSystems, LLC, Manchester, NH (US)

(72) Inventors: Joseph James Judkins, III, Sugar Land, TX (US); Ryan J. Metivier, Merrimack, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 304 days.

(21) Appl. No.: 16/398,739

(22) Filed: Apr. 30, 2019

(65) Prior Publication Data
US 2020/0350912 A1 Nov. 5, 2020

(51) Int. Cl.
| H03K 17/97 | (2006.01) |
| H03K 17/95 | (2006.01) |
| H03K 17/945 | (2006.01) |

(52) U.S. Cl.
CPC ......... H03K 17/97 (2013.01); H03K 17/9505 (2013.01); H03K 17/9517 (2013.01); *H03K 2017/9455* (2013.01)

(58) Field of Classification Search
None
See application file for complete search history.

(56) References Cited

U.S. PATENT DOCUMENTS

| 7,307,824 B2 * | 12/2007 | Bilotti | H03K 17/97 |
| | | | 361/139 |
| 8,008,908 B2 * | 8/2011 | Doogue | G01P 13/00 |
| | | | 324/173 |
| 8,222,888 B2 * | 7/2012 | David | G01R 33/0047 |
| | | | 324/207.13 |
| 10,038,427 B2 * | 7/2018 | Ahn | H03K 3/02335 |
| 10,120,095 B2 * | 11/2018 | Nakayama | G01D 5/2006 |
| 2011/0291678 A1 * | 12/2011 | Pflum | H03K 3/356121 |
| | | | 324/705 |
| 2013/0314836 A1 * | 11/2013 | Christie | H03K 17/0822 |
| | | | 361/95 |

(Continued)

OTHER PUBLICATIONS

"A Guide to Debouncing"; Jack G. Ganssle, The Ganssle Group; Aug. 2004, 26 pages.

(Continued)

*Primary Examiner* — Lincoln D Donovan
*Assistant Examiner* — Khareem E Almo
(74) *Attorney, Agent, or Firm* — Daly, Crowley, Mofford & Durkee, LLP

(57) ABSTRACT

A magnetic switch sensor is provided having a magnetic field sensing element configured to generate a magnetic field signal in response to a magnetic field indicative of a distance or angle between the magnetic field sensing element and a target, a first circuit coupled to receive the magnetic field signal and having an output to provide a comparison signal, and a debounce circuit coupled to receive the comparison signal and having an output to provide a debounced signal. The sensor can include a second circuit having an input coupled to receive the debounced signal and an output at which is provided a toggle signal that transitions between first and second levels every other time the magnetic field signal crosses a threshold level.

21 Claims, 10 Drawing Sheets

(56) References Cited

U.S. PATENT DOCUMENTS

2018/0262194 A1* 9/2018 Ohta ................. H01H 13/14
2020/0350912 A1* 11/2020 Judkins, III ....... H03K 17/9517

OTHER PUBLICATIONS

Allegro MicroSystems. LLC Datasheet APS13568; "LED Driver with Integrated Micropower Hall-Effect Switch"; Feb. 11, 2019; Rev. 1, 22 pages.

Allegro MicroSystems, LLC Datasheet A3211 and A3212; "Micropower, Ultrasensitive Hall-Effect Switches"; Feb. 19, 2019, Rev. 25, 13 pages.

Allegro Microsystems, LLC Datasheet A1266; "Micropower Uitrasensitive 3D Hall-Effect Switch"; Jan. 23, 2019; Rev. 5, 16 pages.

* cited by examiner

MAGNETIC SWITCH WITH TOGGLE AND DE-BOUNCE FUNCTIONALITY

BACKGROUND

As is known, magnetic switch sensors are used to detect proximity of a target to one or more magnetic field sensing elements of the sensor, which target and sensor are capable of motion relative to one another. Example devices may include a stationary portion to which the sensor is attached and a movable portion including a magnet, such as cellular telephones and laptop computers having magnets in moveable door or cover portions.

Some magnetic switch sensors are capable of detecting proximity of a magnetic target regardless of the orientation of the magnetic poles of the magnet relative to the sensor, a capability sometimes referred to as "omnipolar" operation. One such sensor is described in a U.S. Pat. No. 7,307,824, entitled "Magnetic Pole Insensitive Switch Circuit", which patent issued on Dec. 11, 2007 and is assigned to the Assignee of the subject application.

Applications for switches include various human-machine interface (HMI) applications in which humans interface with machines. Mechanical switches are often used in HMI applications.

SUMMARY

In accordance with the concepts, systems, methods and techniques described herein a sensor is provided having a magnetic field sensing element and a circuit coupled to receive a magnetic field signal from the magnetic field sensing element and implement toggle and/or debounce functionality to detect a distance or angle between the magnetic field sensing element and a target. Such magnetic field switch sensors can provide advantages over mechanical switches due to their silent, contactless operation with no moving parts, and their high reliability.

The circuit can include one or more portions to implement de-bounce functionality. For example, the circuit can be configured to implement debounce functionality by using timing logic (e.g., time delays) such that brief or incorrect movements of a target (as may be particularly likely in HMI applications in which the switch sensor is activated by human interaction) that may lead to short-stroking, vibration, bounce, and/or electrical noise can be effectively filtered to prevent (e.g., reject) inaccurate operation of the switch sensor. In an embodiment, time-based micropower operation, including sleep/awake cycle techniques, can be implemented and can be used to control the debounce functionality.

Additionally or alternatively, the circuit can be configured to implement toggle functionality such that an output signal (e.g., toggle signal) of the sensor transitions between first and second levels every other time (e.g., not every time) the magnetic field signal crosses a threshold level. More particularly, with the toggle functionality, the sensor can change a level of a toggle signal (output signal) to effectuate push on/push off (i.e., toggle) behavior in a system in which the target includes a mechanical or other type of switch or device, such as a pushbutton device.

The magnetic field sensing element may include one or more magnetic field sensing elements, such as but not limited to a planar Hall effect elements, vertical Hall effect elements, and/or magnetoresistance elements. The sensor may be configured to detect target movement in various configurations. For example, the sensor can be configured to sense head-on target motion, slide-by target motion, target motion along x, y and z axes (i.e., three dimensional target motion), target rotation to thereby detect the magnetic field angle, and/or any other form of motion that may serve to activate the magnetic field switch sensor.

In a first aspect, a sensor includes a magnetic field sensing element configured to generate a magnetic field signal in response to a magnetic field indicative of a distance or angle between the magnetic field sensing element and a target, a first circuit having an input coupled to receive the magnetic field signal and an output at which is provided a comparison signal indicative of the distance or angle between the magnetic field sensing element and the target, and a debounce circuit having an input coupled to receive the comparison signal and an output at which is provided a debounced signal indicative of the distance or angle between the magnetic field sensing element and the target. The debounce circuit can be configured to debounce the comparison signal. The magnetic field sensing element, the first circuit, and the debounce circuit can be provided in a single integrated circuit.

The sensor may further include a second circuit having an input coupled to receive the debounced signal and an output at which is provided a toggle signal. The second circuit can be configured to cause the toggle signal to transition between a first level and a second level every other time the comparison signal transitions from the first level to the second level.

The target can include a magnet to generate the magnetic field. In some embodiments, the sensor may include a back bias magnet and the target can include a ferromagnetic element. In such an embodiment, the magnetic field sensing element can be positioned between the back bias magnet and the target.

The first circuit can be configured to generate the comparison signal such that the comparison signal transitions from the first level to the second level when the magnetic field signal crosses the predetermined threshold level in a first direction and transitions from the second level to the first level when the magnetic field signal crosses the predetermined threshold level in a second direction.

The first circuit may include Schmitt trigger. The Schmitt trigger can include a window comparator.

The second circuit may include a flip-flop. The debounce circuit may include a filter. The magnetic field sensing element, the first and second circuits, and the debounce circuit can be provided in a single integrated circuit.

In some embodiments, the sensor includes a switch coupled to the circuit and configured to selectively activate at least a portion of the first circuit for an activation portion of each of a plurality of consecutive time periods. The debounce circuit can be configured to cause the comparison signal to transition when the comparison signal is at the same level for a predetermined number of activation portions of consecutive time periods.

The magnetic field sensing element, the first and second circuits, the debounce circuit and the switch can be provided in a single integrated circuit.

In another aspect, a sensor includes a magnetic field sensing element configured to generate a magnetic field signal in response to a magnetic field indicative of a distance or angle between the magnetic field sensing element and a target, and a first circuit having an input coupled to receive the magnetic field signal and an output at which is provided a comparison signal indicative of the distance between the magnetic field sensing element and the target. The first circuit is configured to cause the comparison signal to transition from a first level to a second level when the magnetic field signal crosses a predetermined threshold level. The sensor further includes a switch coupled to the first circuit and configured to selectively activate at least a portion of the first circuit for an activation portion of each of a plurality of consecutive time periods, and a debounce circuit responsive to the comparison signal to generate an output signal. The debounce circuit is configured to cause the output signal to transition when the comparison signal is at the same level for a predetermined number of activation portions of consecutive time periods.

The sensor further may include a second circuit responsive to the comparison signal and configured to generate a toggle signal to transition from a first level to a second level every other time the magnetic field signal crosses the predetermined threshold level, wherein the debounce circuit is responsive to the comparison signal to generate the output signal.

The magnetic field sensing element, the first and second circuits, the switch and the debounce circuit can be provided in a single integrated circuit. The target may include a magnet to generate the magnetic field.

The sensor may include a back bias magnet and the target can include a ferromagnetic element. In such an embodiment, the magnetic field sensing element can be positioned between the back bias magnet and the target.

In another aspect, a sensor includes means for generating a magnetic field signal in response to a magnetic field indicative of a distance or angle between the magnetic field signal generating means and a target, means coupled to the magnetic field signal generating means for generating a comparison signal that transitions every time the magnetic field signal crosses a predetermined threshold level, and debouncing means coupled to the comparison signal generating means for generating a debounced signal indicative of the distance or angle between the magnetic field signal generating means and the target. The debouncing means can be configured to debounce the comparison signal.

The sensor may further include means coupled to the debouncing means for generating a toggle signal. The toggle signal generating means can be configured to cause the toggle signal to transition from a first level to a second level every other time the magnetic field signal crosses the predetermined threshold level.

The sensor may include switching means coupled to the comparison signal generating means and configured to selectively activate the comparison signal generating means for an activation portion of each of a plurality of consecutive time periods. In some embodiments, the debouncing means can be configured to generate the debounced signal such that the debounced signal transitions when the comparison signal is at the same level for a predetermined number of activation portions of consecutive time periods.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

The foregoing features may be more fully understood from the following description of the drawings in which.

DETAILED DESCRIPTION

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as an Indium Antimonide (InSb) element, a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

Figures 1, 1A:
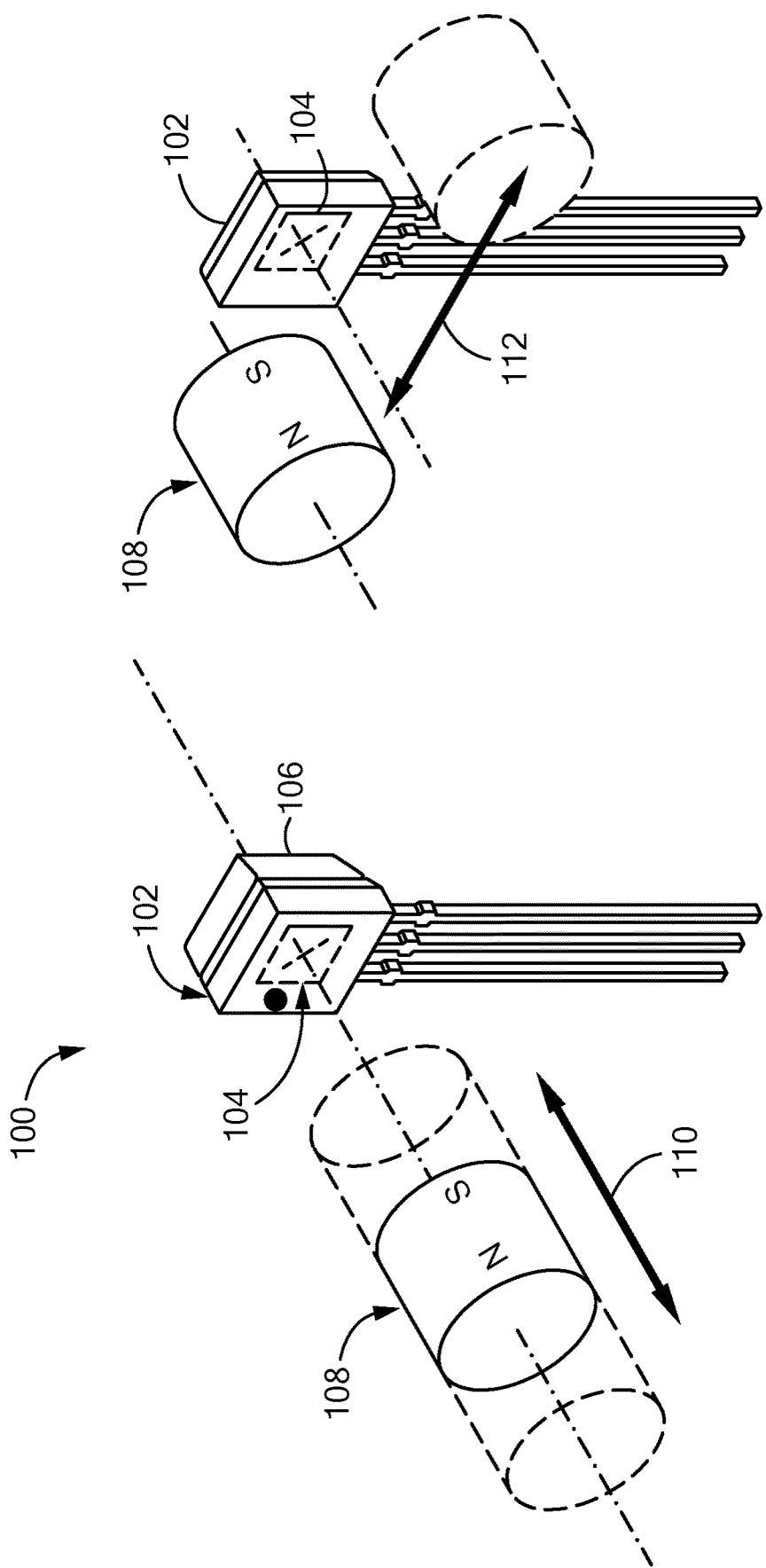
FIG. 1 shows a magnetic switch sensor disposed proximate to a moving target in a "head-on" configuration.
FIG. 1A shows a magnetic switch sensor disposed proximate to a moving target in a "slide by" configuration.
Figure 1C:
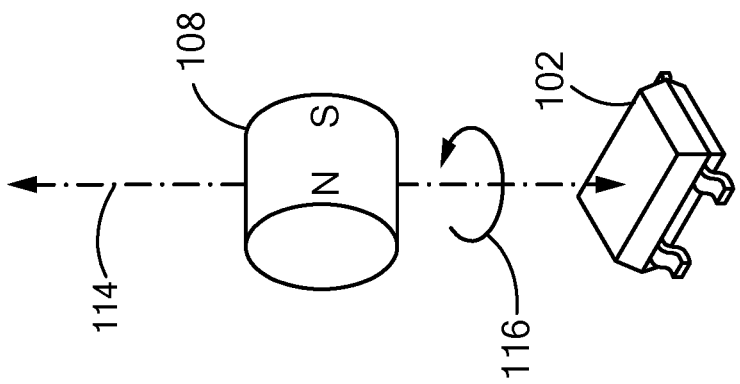
FIG. 1C shows a magnetic switch sensor disposed proximate to a rotating target to detect an angle of the target relative to the sensor.

Now referring to FIGS. 1-1C, in which like reference numerals indicate like elements, a sensor arrangement 100 includes a sensor 102 disposed proximate to a target 108. The sensor 102 includes one or more magnetic field sensing elements 104 positioned to sense a magnetic field generated in response to movement of target 108.

In an embodiment, the sensor 102 may be positioned proximate to, include or be included in various types of human-machine interfaces having mechanical and/or magnetic switch components. In such embodiments, target 108 may be a component of the human-machine interface (e.g., component of a switch) and sensor 102 can be configured to detect a distance and/or angle of target 108 relative to sensor 102 to detect, for example, if the respective switch has been closed and/or opened.

Target 108 may include a magnet (e.g., permanent magnet, electromagnet, etc.) capable of generating a magnetic field or various types of ferromagnetic material capable of affecting a magnetic field. Sensor 102 includes one or more magnetic field sensing elements 104 to detect the proximity and/or angle of a magnetic field associated with target 108. As target 108 moves closer to magnetic field sensing element 104 or into a particular angle with respect to magnetic field sensing element 104, a strength of the magnetic field can increase and a corresponding strength of a magnetic field signal generated by magnetic field sensing element 104 can increase. Thus, the magnetic field sensing element 104 can provide the magnetic field signal to indicate a distance and/or angle of target 108 relative to sensor 102. For example, in one embodiment, the magnetic field signal can be used to determine if a pushbutton or other type of switch associated with the target 108 is open or closed.

Sensor 102 may include a back bias magnet 106. For example, and as stated above, target 108 may include a ferromagnetic element and magnetic field sensing element 102 can be positioned between target 108 and the back bias magnet 106.

The illustrative embodiment of FIG. 1 shows target 108 having a "head-on" configuration with respect to sensor 102, whereby the target moves towards and away from the sensor along an axis 110. However, it should be appreciated that sensor 102 can be configured to sense a variety of different types of motions (e.g., head-on, slide-by, rotation, etc.) to detect a distance and/or angle of target 108 relative to sensor 102. In general, sensor 102 can be configured to sense any relative motion between the target 108 and sensor 102.

For example, and as illustrated in FIG. 1A, target 108 has a "slide-by" configuration with respect to sensor 102 and magnetic field sensing element 104, whereby the sensor 102 is configured to detect proximity of target 108 as it moves along an axis 112. Magnetic field sensing element 104 can provide the magnetic field signal to indicate the distance of target 108 relative to sensor 102.

Figure 1B:
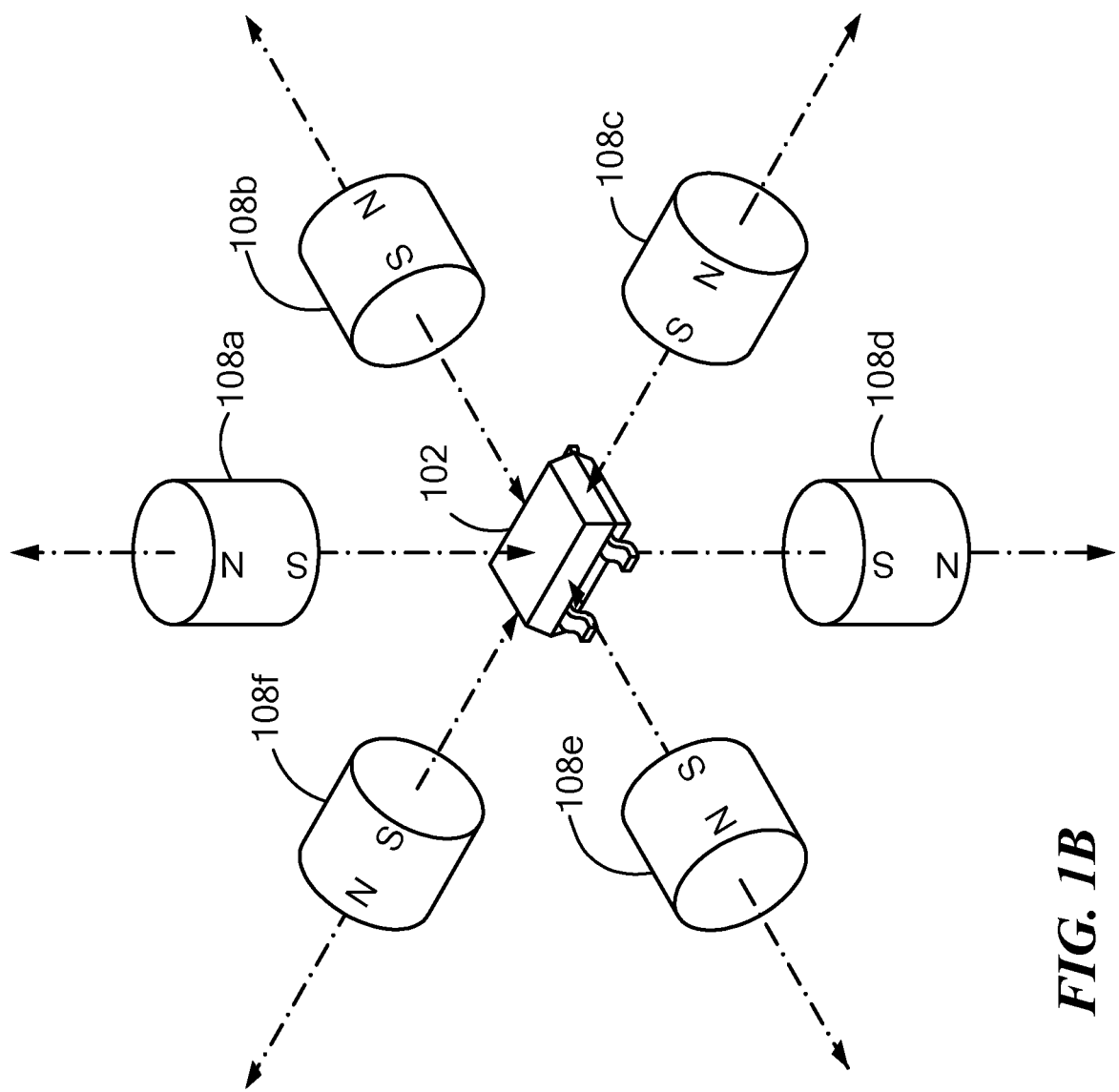
FIG. 1B shows a magnetic switch sensor disposed proximate to targets moving in various directions with respect to the sensor in a "3D" configuration.

It should further be appreciated that magnetic field sensing element 104 can be configured to detect multiple axes of motion and/or alternative axes of motion. For example, and as illustrated in FIG. 1B, a plurality of targets 108a-108f are illustrated movable along multiple respective axes of motion with respect to sensor 102. In an embodiment, sensor 102 and thus magnetic field sensing element 104 can be configured to perform two-dimensional sensing and/or three-dimensional sensing to detect the proximity of one or more targets 108a-108f with respect to sensor 102.

Now referring to FIG. 1C, in some embodiments, magnetic field sensing element 104 can be configured to detect an angle of target 108 relative to sensor 102. For example, target 108 may rotate about an axis 114 as shown by arrow 116. In such an embodiment, the distance from target 108 to sensor 102 may not change, however the angle of target 108 relative to sensor 102 does change and magnetic field sensing element 104 can detect this angle. It should be appreciated that in other embodiments, sensor 102 can be rotated relative to target 108 to detect the angle of target 108 relative to sensor 102.

Magnetic field sensing element 104 may include one or more Hall effect elements and/or one or more magnetoresistance elements. The Hall effect elements may include planar Hall effect elements, vertical Hall effect elements, or Circular Vertical Hall (CVH). The magnetoresistance elements may include at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

Figure 2:
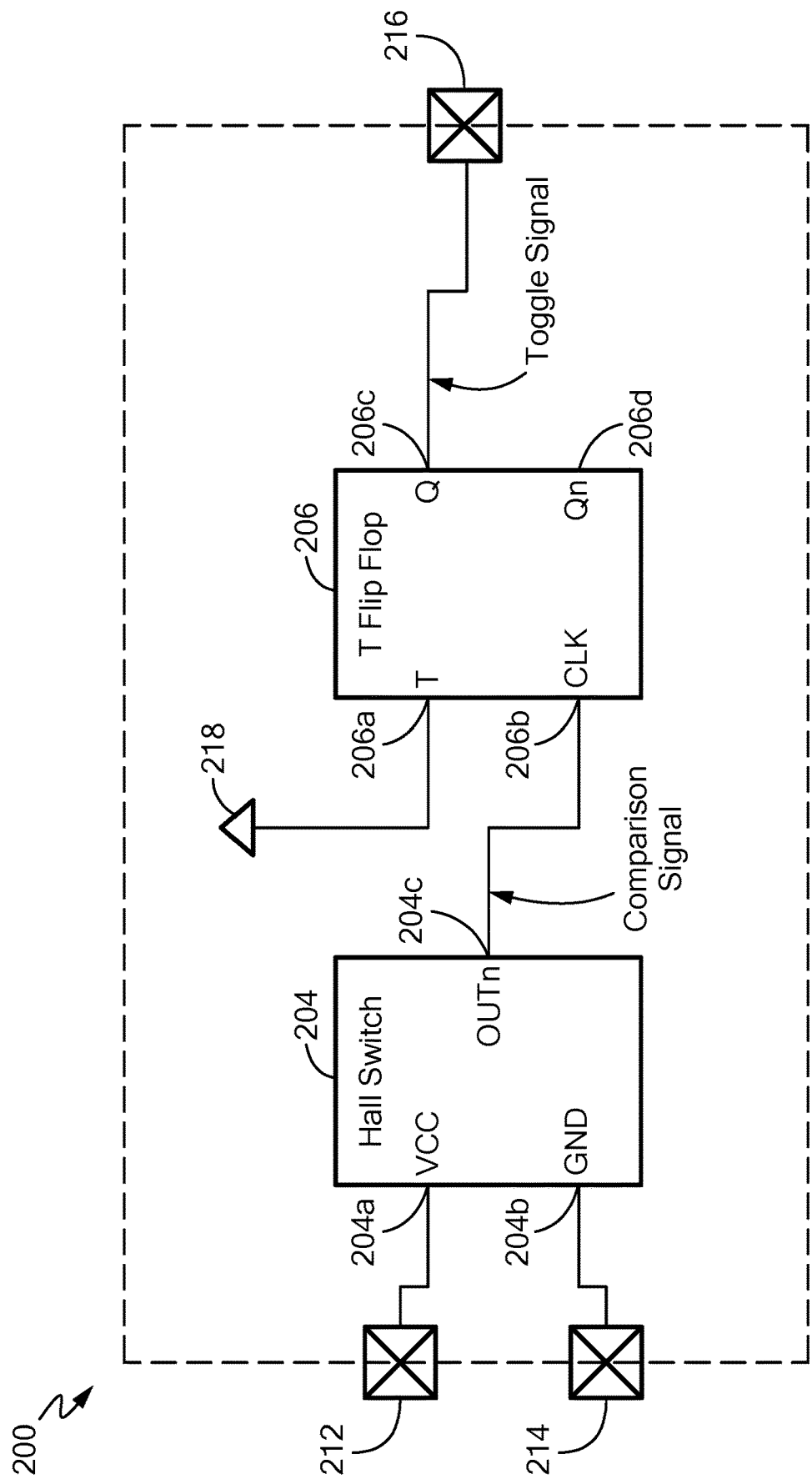
FIG. 2 is a block diagram of a sensor integrated circuit having a magnetic field sensing element coupled to a circuit.

Now referring to FIG. 2, a sensor integrated circuit 200 includes a switch element 204 coupled to a circuit 206. In an embodiment, integrated circuit 200 may be the same as or substantially similar to sensor 102 of FIG. 1.

Switch element 204 may include one or more Hall effect elements (here one) and circuitry as may include one or more comparators with or without hysteresis (e.g., Schmitt triggers). A first terminal 204a of switch element 204 is coupled to a supply voltage 212 and a second terminal 204b of switch element 204 is coupled to a reference potential 214 (e.g., ground terminal).

Switch element 204 can be configured to generate a magnetic field signal indicative of a distance and/or angle of a target (target 108 of FIG. 1) relative to switch element 204. Further, circuitry of the switch element 204 can be configured to generate a comparison signal in response to the magnetic field signal. Switch element 204 can provide the comparison signal to a circuit 206 through an output terminal 204c that is coupled to a second terminal 206b (e.g., clock terminal) of circuit 206.

Circuit 206 can include one or more circuit components (see sensor 300 of FIG. 3) configured to generate a toggle signal. In FIG. 2, circuit 206 is provided having a "T flip-flop" circuit configuration. However, it should it should be appreciated that other types of circuitry may be used to implement toggle functionality. For example and without limitation, in some embodiments, circuit 206 may include a controller (e.g., microcontroller, logic state-machine) to implement toggle functionality.

In the illustrative embodiment of FIG. 2, the first terminal 206a may correspond to a control input terminal, the second terminal 206b may correspond to a clock input terminal, third terminal 206c may correspond to an output terminal and fourth terminal 206d may correspond to an inverted output terminal. With the control terminal 206a coupled to a reference potential (e.g., supply voltage Vcc 218), the flip-flop output at terminal 206c can be held constant between like clock signal edges. Third terminal 206c can be configured to provide an output signal of circuit 206 at output 216, also referred to herein as a toggle signal, which toggle signal is thus held at a constant value from one positive-going clock signal edge to the next positive-going clock signal edge (or alternatively from one negative-going clock signal edge to the next negative-going clock signal edge).

Circuit 206 can receive the comparison signal from switch element 204 and generate the toggle signal.

Figure 2A:
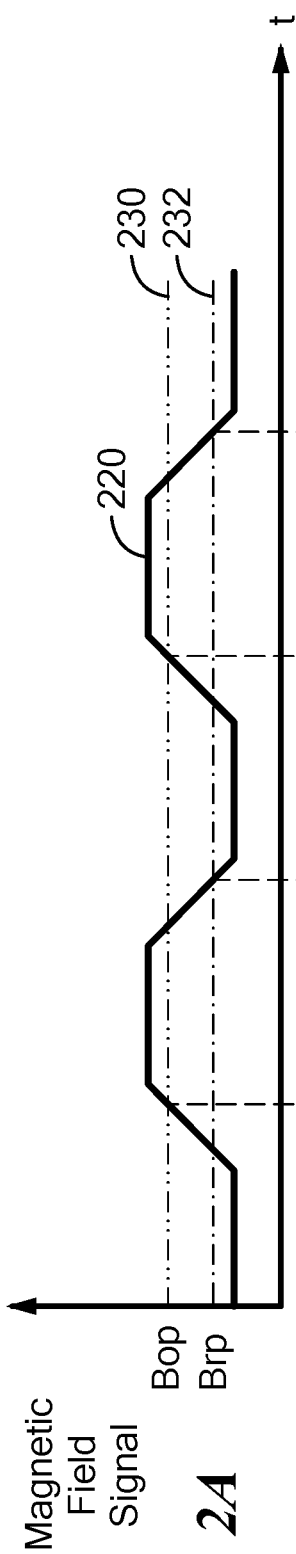
FIG. 2A shows a plot of a magnetic field signal.
Figure 2B:
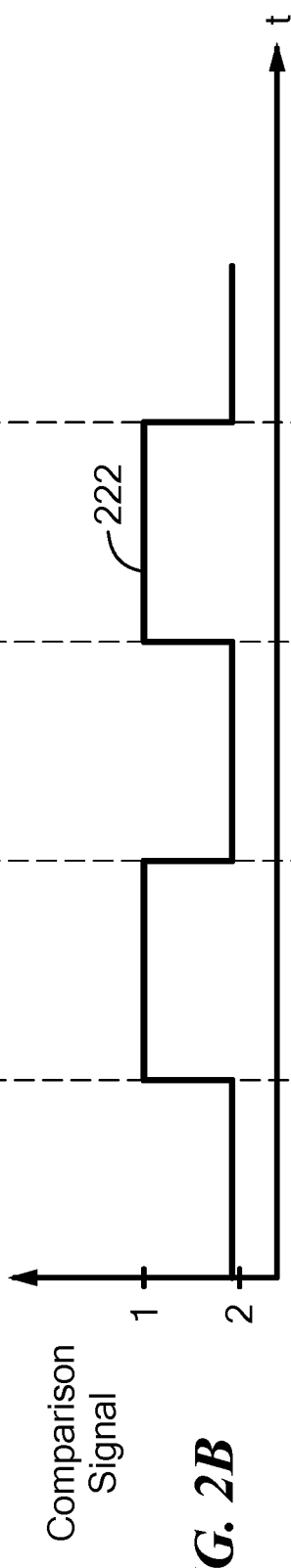
FIG. 2B shows a plot of a comparison signal generated based on the magnetic field signal of FIG. 2A.
Figure 2C:
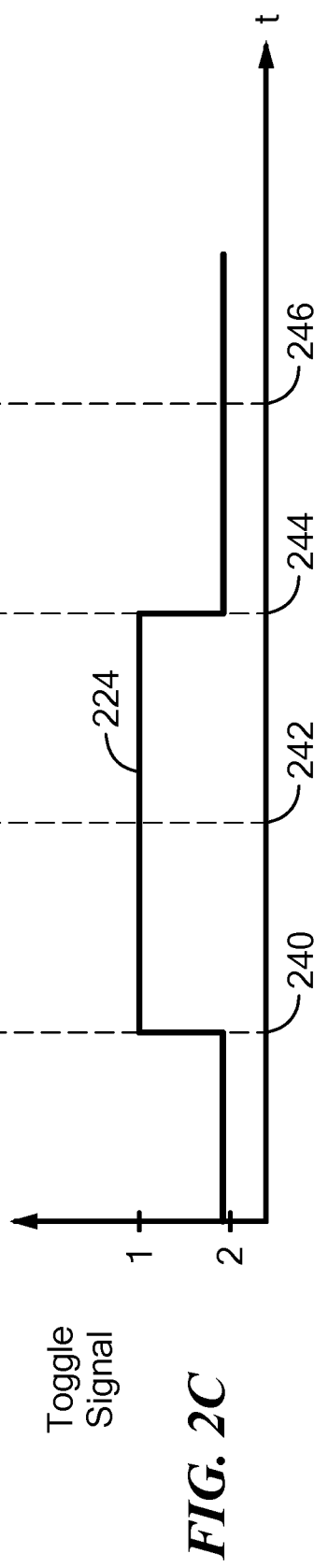
FIG. 2C shows a plot of a toggle signal generated based on the magnetic field signal of FIG. 2A and the comparison signal of FIG. 2B.

Referring to FIGS. 2A-2C, plots of an example magnetic field signal (FIG. 2A) generated by a magnetic field sensing element (e.g., switch element 204 of FIG. 2) in response to movement of a target (e.g., target 108 of FIG. 1), the corresponding comparison signal (FIG. 2B) generated by a switch (e.g., switch element 204 of FIG. 2), and the corresponding toggle signal (FIG. 2C) generated by a circuit (e.g., circuit 206 of FIG. 2) are provided.

FIG. 2A illustrates a magnetic field signal 220 corresponding to movement of the target relative to a magnetic field sensing element. As the target approaches the magnetic field sensing element (or in the case of angle detection, moves towards a particular angle with respect to the magnetic field sensing element), a level (e.g., strength) of the magnetic field signal increases and as the target moves away from the magnetic field sensing element, the level of the magnetic field signal decreases. When the magnetic field signal 220 crosses a threshold level, this may indicate that a pushbutton or other type of switch associated with the target has been activated.

In embodiments, the threshold level may include one or more threshold values 230, 232. In the illustrative embodiment of FIG. 2A, the threshold includes a first threshold level Bop, 230 and second threshold level Brp, 232. However, it should be appreciated that in other embodiments, the threshold level may be one threshold level (i.e., one value) or even more than two threshold levels.

Still referring to FIG. 2A-C, the magnetic field signal 220 increases and reaches the first threshold level 230 (e.g., in a first direction). Responsive to the magnetic field signal 220 crossing the first threshold level (Bop) 230 at a time 240, the comparison signal 222 may transition from a second level to a first, different level (i.e., change state). The toggle signal 224 transitions its respective level in response to the magnetic field signal 220 crossing the first threshold level 230 and the comparison signal 222 changing state from a second level to a first level (in the example shown), i.e. the toggle signal 224 transitions on a rising edge transition of the comparison signal 222 from the second level to the first level. When the magnetic field signal 220 crosses the second threshold level (Brp) 232 at a time 242 (e.g., in a second direction), the comparison signal 222 transitions from the first level to the second level. The toggle signal 224 does not transition from the first level to the second level but holds its state at the first level, i.e. the toggle signal does not transition on a falling edge of the comparison signal. When the magnetic signal 220 transitions past the first threshold level 230 at time 244 the comparison signal 222 transitions from the second level to the first level, i.e. the comparison signal 222 has a rising edge. The toggle signal 224 transitions from the first level to the second level. When the magnetic field signal 220 crosses the second threshold level (Brp) 232 at a time 246 (e.g., in a second direction), the comparison signal 222 transitions from the first level to the second level. The toggle signal 224 does not transition from the second level to the first level but holds its state at the second level. Thus the toggle signal 224 only transitions its state when the comparison signal 222 changes from a second level to a first level, i.e. on a rising edge of the comparison signal 222 in FIG. 2B, in this example. In other embodiments the toggle signal 224 transitions may occur only on the falling edges of the comparison signal 222.

In this way, the toggle signal 224 can be generated by circuitry having components to enable toggle functionality (e.g., T flip-flop) so as to cause the toggle signal 224 to transition between the first and second level every other time the magnetic field signal 220 crosses a threshold level (i.e., every other time a switch, such as a pushbutton switch to which the target is mounted, is activated). Thus, when the target first approaches the sensor (i.e., the first activation), the toggle signal latches on and remains on when the target is moved away from the sensor. The next time the target approaches the sensor (i.e., the second activation), the toggle signal transitions to the opposite state.

Figure 3:
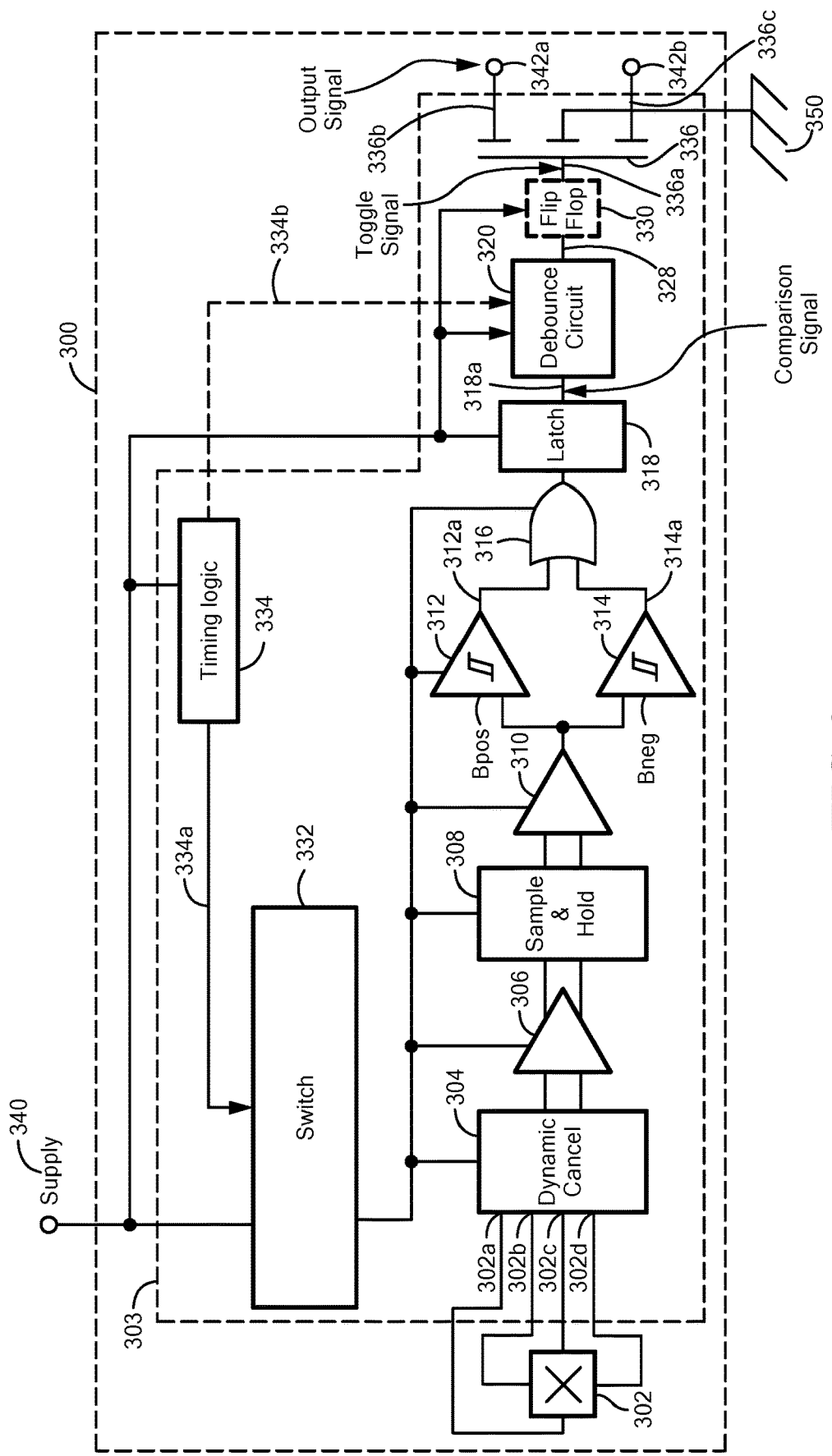
FIG. 3 is a circuit diagram of a magnetic switch sensor.

The plots provided in FIGS. 2A-2C illustrate unipolar switch operation, but could also be run as an omnipolar device and thus generally correspond to operation of circuit 303 of FIG. 3. In this example, the toggle signal 224 transitions every other time the magnetic field signal 220 crosses the magnitude of the threshold level 230. In general, the toggle signal transitions every other time the comparison signal crosses a predetermined threshold level.

The toggle signal 224 may correspond to an output of a sensor (e.g., sensor 102 of FIG. 1). The toggle functionality can be used to indicate activation of a pushbutton or other type of device or switch (e.g., such as an opening or closing of a switch). For example, in one embodiment with the toggle functionality enabled, the sensor can change a level of a toggle signal (output signal) to indicate the closing of a switch but maintain the level of the toggle signal during the opening of the switch. In other embodiments, with the toggle functionality enabled, the sensor can change a level of a toggle signal (output signal) to indicate the opening of a switch but maintain the level of the toggle signal during the closing of the switch.

Figure 2D:
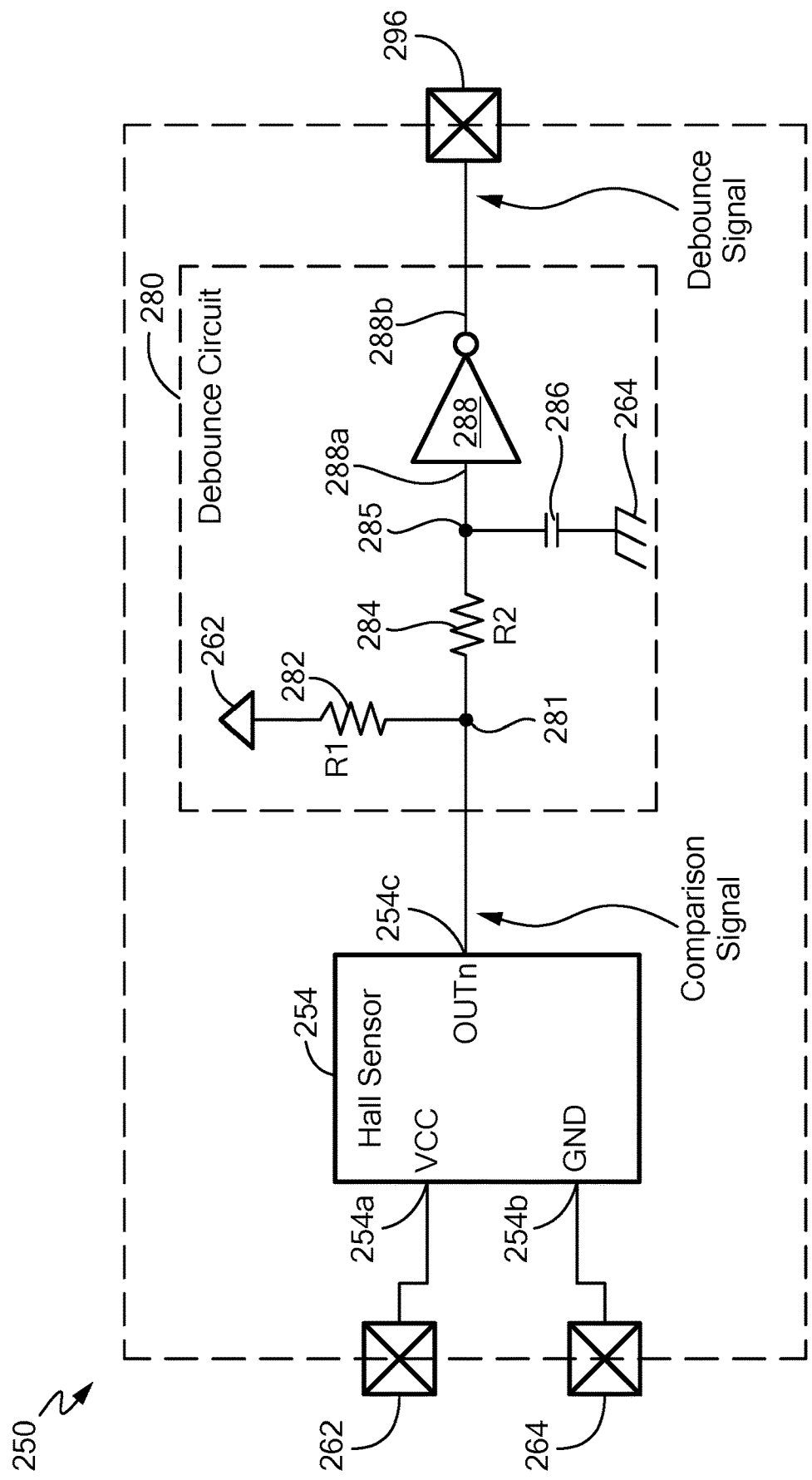
FIG. 2D is a block diagram of a sensor integrated circuit having a magnetic field sensing element coupled to a circuit for debounce.

Now referring to FIG. 2D, a sensor integrated circuit 250 includes a switch element 254 coupled to a circuit 280. In an embodiment, integrated circuit 250 may be the same as or substantially similar to sensors 102 of FIG. 1, or 200 of FIG. 2.

Switch element 254 may include one or more Hall effect elements (here one) and circuitry as may include one or more comparators with or without hysteresis (e.g., Schmitt triggers). A first terminal 254a of switch element 254 is coupled to a supply voltage 262 and a second terminal 254b of switch element 254 is coupled to a reference potential 264 (e.g., ground terminal).

Switch element 254 can be configured to generate a magnetic field signal indicative of a distance and/or angle of a target (target 108 of FIG. 1) relative to switch element 254. Further, circuitry of the switch element 254 can be configured to generate a comparison signal in response to the magnetic field signal. Switch element 254 can provide the comparison signal to a circuit 280 through an output terminal 254c that is coupled to a node 281 of circuit 280.

Circuit 280 can include one or more circuit components (see sensor 300 of FIG. 3) configured to generate a debounced comparison signal indicative of a distance and/or angle of a target (target 108 of FIG. 1) relative to switch element 254. In FIG. 2D, circuit 280 is provided with an RC filter configuration. However, it should be appreciated that other types of circuitry may be used to implement debounce functionality.

In the illustrative embodiment of FIG. 2D, debounce circuit 280 has an RC filter circuit and a buffer amplifier. Supply voltage 262 is connected to a first end of resistor 282 and node 281 is coupled to a second end of resistor 282. Node 281 connects the output 254c of the switch element 254, the second end of resistor 282, and a first end of resistor 284. A second end of resistor 284 is coupled to node 285. Node 285 connects the second end of resistor 284, a first side of capacitor 286, and a buffer amplifier 288 at input 288a. Capacitor 286 is coupled to node 285 on a first end and a second side of capacitor 286 is coupled to a reference voltage 264 (i.e., a ground reference). Buffer amplifier 288 is connected to node 285 through input 288a. The buffer output 288b is coupled to the circuit output 296.

Circuit 280 can receive the comparison signal from switch element 254 and generate a debounce signal at output 296 to indicate a distance and/or angle of a target (target 108 of FIG. 1) relative to switch element 254.

Now referring to FIG. 3, a magnetic field switch sensor 300 (hereinafter sensor 300) includes a magnetic field sensing element 302 coupled to a circuit 303. Sensor 300 may be the same as or substantially similar to sensor 102 of FIG. 1 or integrated circuit sensor 200 of FIG. 2. Magnetic field sensing element 302 may be the same as or substantially similar to magnetic field sensing element 104 of FIG. 1. In an embodiment, circuit 303 can be configured for omnipolar sensing applications.

Magnetic field sensing element 302 may include one or more Hall effect elements. The magnetic field signal provided by magnetic field sensing element 302 may be indicative of a distance and/or angle between magnetic field sensing element 302 and a target object (e.g., target 108 of FIG. 1). Magnetic field sensing element 302 can be coupled to various circuit components of circuit 303 for signal processing to generate a sensor output indicative of the distance or angle between magnetic field sensing element 302 and the target object.

In an embodiment, the magnetic field sensing element 302 may have one or more outputs 302a-302d (here four) coupled to an input of a dynamic offset cancellation module 304 to reduce an offset (e.g., provide trimming and/or chopping) associated with the magnetic field signal. The dynamic offset cancellation module 304 is coupled to a first amplifier 306, which first amplifier 306 is coupled to a sample and hold module 308. In an embodiment, sample and hold module 308 can be configured to sample the signal received from first amplifier 306 and store its value for a predetermined time period, for example, for use in implementing dynamic offset cancellation A second amplifier 310 has inputs coupled to the sample and hold module 308 and an output coupled to an input of a first comparator (e.g., Schmitt trigger with hysteresis) 312 and an input of a second comparator (e.g., Schmitt trigger with hysteresis) 314, the outputs of which are coupled to inputs of a logic gate 316 (e.g., OR gate), as shown. Schmitt triggers 312, 314 are configured to provide switching on the positive Bpos and negative Bneg values of Bop and Brp such that the output 312a of one such circuit 312 transitions when the input signal 310a crosses a positive value of a first threshold level (Bop in FIG. 2A), the output signal 314a of the other such circuit 314 transitions if the input signal 310a crosses a second, negative value of threshold level (magnitude of Brp in FIG. 2A, and the output of the OR gate 316 transitions if either or both of output signals 312a, 314a transition to a particular logic level, such as a high logic level. In this way, the comparison operation is provided such that the output signal of OR gate 316 is at a first level when the signal 310a has a magnitude or magnetic field amplitude above threshold level Bop and is at a second level when the signal 310a is below of this range magnitude of magnetic field levels. An output of logic gate 316 is coupled to an input of a latch circuit 318 having an output at which a comparison signal is provided.

The comparison signal 318a is coupled to an input of a debounce circuit 320. Debounce circuit 320 can be configured to provide debounce functionality to sensor 300. A timing logic circuit 334 can generate timing control signals 334a, 334b. Control signals 334a can be coupled to a switch 332 to implement a lower power, or micropower mode of operation as described below. Control signals 334b can be coupled to the debounce circuit 320 for use in the debounce functionality as described below. It will be appreciated however that the debounce circuit 320 can alternatively take on various conventional forms, including but not limited to one or more of a circuit such as the debounce circuit 280 in FIG. 2D, an analog, digital, or mixed signal filter, etc. Timing logic 334 will be described in greater detail below.

A debounce signal 328 is the output of debounce circuit 320 and is coupled to an input of a flip-flop circuit 330. In an embodiment, flip-flop circuit 330 may be a component of or be a second portion of circuit 303 as described herein and generate a toggle signal (e.g., toggle signal 224 of FIG. 2C) responsive to a received magnetic field signal. Flip-flop circuit 330 can be configured to implement toggle functionality, for example, such as the toggle functionality described above with respect to FIGS. 2-2C. In another embodiment flip-flop circuit 330 is removed and the circuit for sensor 300 only provides a debounce function without toggle.

An output of flip-flop circuit 330 is coupled to a first terminal 336a of a transistor 336. A second terminal 336b and third terminal 336c may be coupled to output terminals 342a, 342b, respectively of sensor 300. Third terminal 336c may additionally be coupled to reference potential 350 (e.g., ground).

In some embodiments, transistor 336 includes an n-channel metal oxide semiconductor field effect transistor (MOSFET). In such an embodiment, first terminal 336a corresponds to a gate terminal, second terminal 336b corresponds to a drain terminal and third terminal 336c corresponds to a source terminal. Output terminals 342a, 342b can provide an output signal indicative of the distance between magnetic field sensing element 302 and a target.

Sensor 300 includes a switch circuit 332 having one or more switches. A power supply 340 is coupled to switch circuit 332, timing logic 334 and latch circuit 318 through a connection 340. The power supply 340 can provide power to each of switch circuit 332, timing logic 334, Latch circuit 318, debounce circuit 320, and flip-flop 330.

Timing logic 334 generates control signal 334a coupled to switch circuit 332 and may optionally generate control signal 334b coupled to debounce circuit 320. In some embodiments, control signal 334a and control signal 334b may be the same control signal. Timing logic 334 can be used to implement debounce functionality, for example, by implementing time delays within sensor 300 to prevent one or more signal levels (e.g., the comparison signal 318a) from changing state until predetermined conditions have occurred as will be discussed. In an embodiment, timing logic 334 may include an oscillator, one or more dividers circuits, and one or more counter circuits to generate various control and timing signals.

In an embodiment, responsive to the timing signal 334a from timing logic 334, switch circuit 332 can couple and decouple the power supply connection in order to thereby enable or disable (e.g., turn on or off) one or more elements or components of the sensor 300, such as dynamic cancellation module 304, amplifier 306, sample and hold module 308, amplifier 310, comparators 312, 314 and/or logic gate 316. For example, and as illustrated in FIG. 3, switch circuit 332 is coupled to each of dynamic cancellation module 304, amplifier 306, sample and hold module 308, amplifier 310, comparators 312, 314 and logic gate 316 to thereby enable or disable the respective component of sensor 300, by selectively coupling or decoupling the component(s) from the power supply 340. In this way, responsive to the timing signal 334a, switch circuit 332 can enable or disable portions of sensor 300 to implement awake and sleep cycles of operation in order to thereby implement a micropower feature.

Figure 3A:
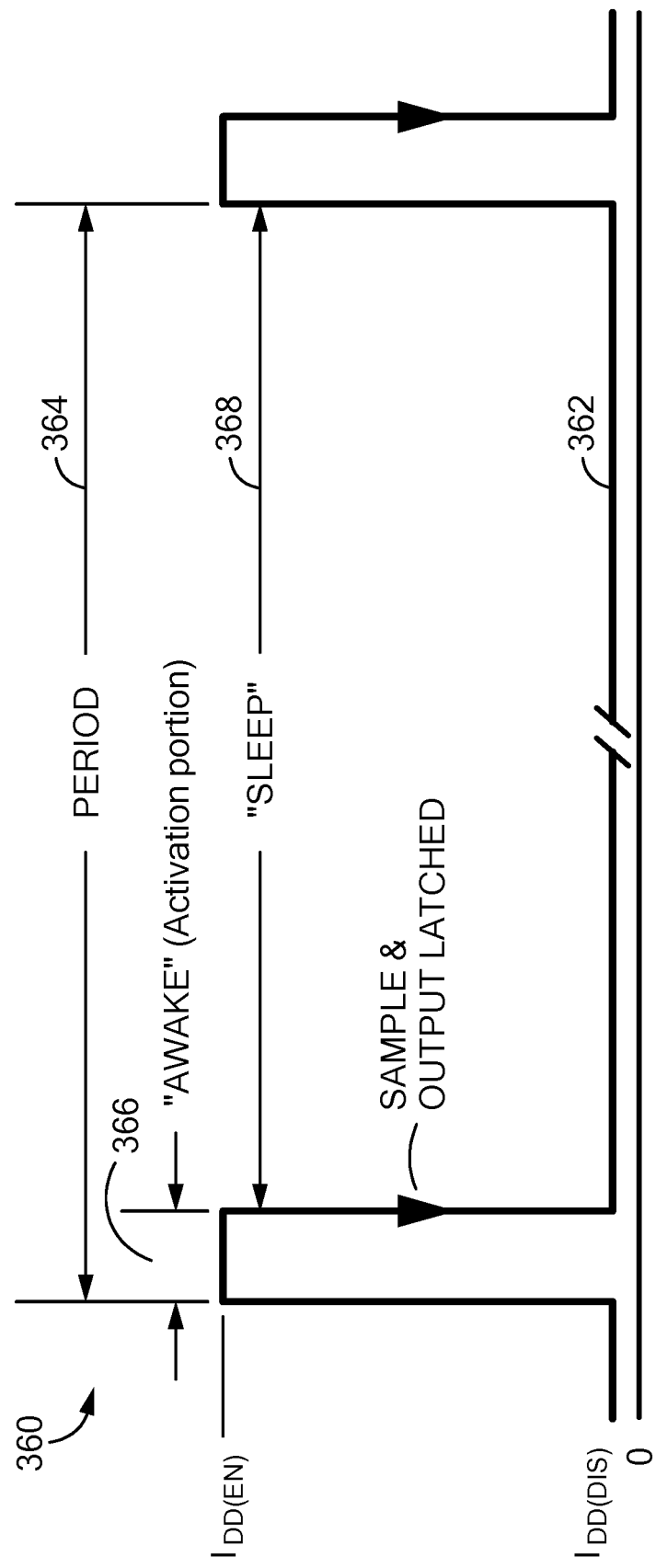
FIG. 3A shows a plot of the timing and a current waveform of the sensor of FIG. 3.

For example, and now referring to FIG. 3A, a timing diagram 360 is provided showing a plot of changes in level of a supply current 362 during awake 366 and sleep 368 portions, during one example embodiment of a period 364 of operation of sensor 300. In embodiments, the awake portions 366 may be referred to as activation portions and periods 364 may be referred to as time periods.

As illustrated in FIG. 3A, supply current 362 may transition from a first level (here a disabled level) to a second, different level (here an enabled level) during the awake portion 366 of a period 364 and transition from the second level to the first level during the sleep portion 368 of the period 364. In an embodiment, during the sleep portion 368, an output signal from magnetic field sensing element 302 may be stored by flip flop 330 for one or more periods 364 (or for a predetermined period). The level of a comparison signal 318a generated by latch circuit 318 may be maintained (e.g., does not change state) during the sleep portion 368.

Timing logic 334 may be incorporated into sensor 300 for power management and/or to implement debounce functionality. The timing logic can be configured to enable and disable (e.g., turn on and off) one or more of the components of sensor 300 at a predetermined rate to reduce power consumption when the components are disabled and/or implement time delays to prevent one or more of the components of sensor 300 from changing state until a predetermined condition occurs.

The timing logic control signal 334b can be used to prevent and/or reject incomplete or brief cycles of motion and thus prevent inaccuracies in the sensor output. For example, sensor 300 may be implemented into a switch system and the respective switch may be exposed to or otherwise experience uneven mechanical motion or affected by vibration, mechanical oscillations ("bounce") or other environmental issues that may create movement not intended to be a switch activation (e.g., not an actual open or close of the switch). The motion may potentially cause an incorrect output of the sensor 300. The timing logic can be used to implement time delays such that brief or incorrect movements of a switch that may lead to short-stroking, vibration, bounce, and/or electrical noise can be filtered out and prevent inaccurate readings of the switch by sensor 300.

It should be appreciated that the arrangement of components within circuit 303 of FIG. 3 is one example embodiment of a circuit to implement an omnipolar switch portion of circuit 303 to generate comparison signal 318a and that the components of circuit 303 can be re-arranged (e.g., disposed at different positions and coupled to different components) within circuit 303 to generate the comparison signal 318a. In some embodiments, one or more components of circuit 303 can be omitted and/or replaced with other known circuit components having similar characteristics to generate the comparison signal 318a. Further, circuit 303 can be configured to perform unipolar sensing applications.

Figure 4:
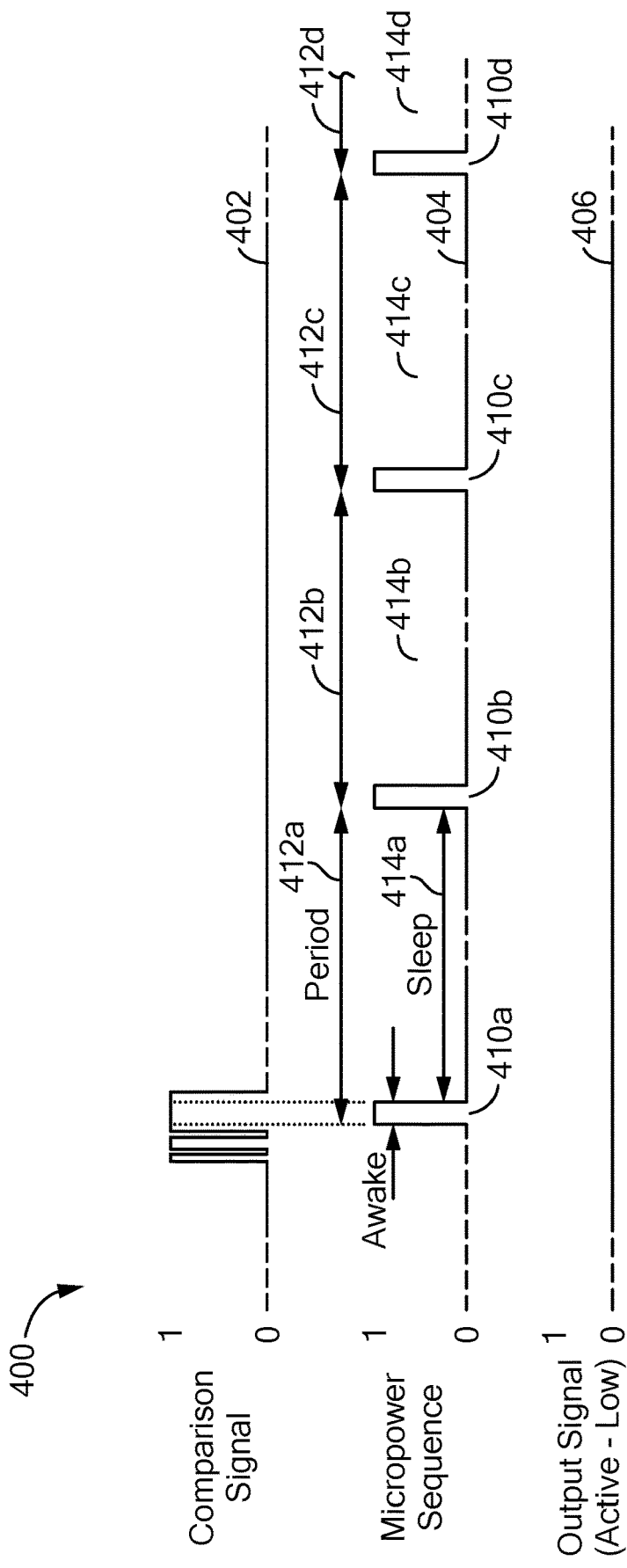
FIG. 4 shows a plot illustrating use of a micropower sequence to implement debounce functionality by illustrating the relationship between a comparison signal, micropower sequence and the corresponding output signal.

Now referring to FIG. 4, a plot 400 illustrating use of a micropower sequence to implement debounce functionality is provided showing the relationship between an example comparison signal 402, micropower sequence 404 and the corresponding output signal 406 of a sensor. The debounce functionality can be implemented using the micropower sequence 404 by detecting a level of the comparison signal 402 at different time intervals.

The comparison signal 402 can be the same as or substantially similar to comparison signal 318a of FIG. 3, and thus can be generated in response to a received processed magnetic field signal, with the magnetic field signal generated by a magnetic field sensing element in response to the movement of a target (e.g., movement of a switch) relative to the sensing element. In an embodiment, the comparison signal 402 can change levels, transitions between a first and second level, in response to an activation of a switch or other device type, such as a pushbutton device. The micropower sequence 404 can be provided by timing logic 334 of FIG. 3, for example in the form of control signal 334b, for use by a debounce circuit (e.g., circuit 320 of FIG. 3) to generate a debounced version of the comparison signal.

For example, in the illustrative embodiment of FIG. 4, a sensor can be configured to detect an activation of a switch if the level (i.e., state) of the comparison signal 402 is maintained for two or more successive awake portions 410a-410b of respective periods 412a-412b. In response to the comparison signal 402 maintaining its level for two or more successive awake portions, the output signal 406 of the sensor can be transitioned (changes level, state) and thus indicates a correct activation of the switch. If the comparison signal 402 is at different levels during successive awake portions, the movement may be rejected as an incomplete or false activation of the switch.

The micropower sequence 404 includes multiple periods 412a-412d, with each period having an awake portion 410a-410d and sleep portion 414a-414d. During each of the awake portions 410a-410d, the sensor may read or otherwise detect the level of comparison signal 402.

In FIG. 4, the comparison signal 402 transitions from a first level (0) to a second level (1) prior to a first awake portion 410a. However, during the second awake portion 410b, the comparison signal 402 has already (i.e., during sleep portion 414a) transitioned from the second level to the first level. Therefore, the level of the comparison signal 402 has not been maintained for two successive awake portions. In response, the output signal 406 does not change levels and maintains its level. Therefore, the movement of the target that caused the comparison signal 402 to transition from the first level to the second level during the first period 412a of the micropower sequence 404 can be rejected as an incomplete or false reading.

Figure 4A:
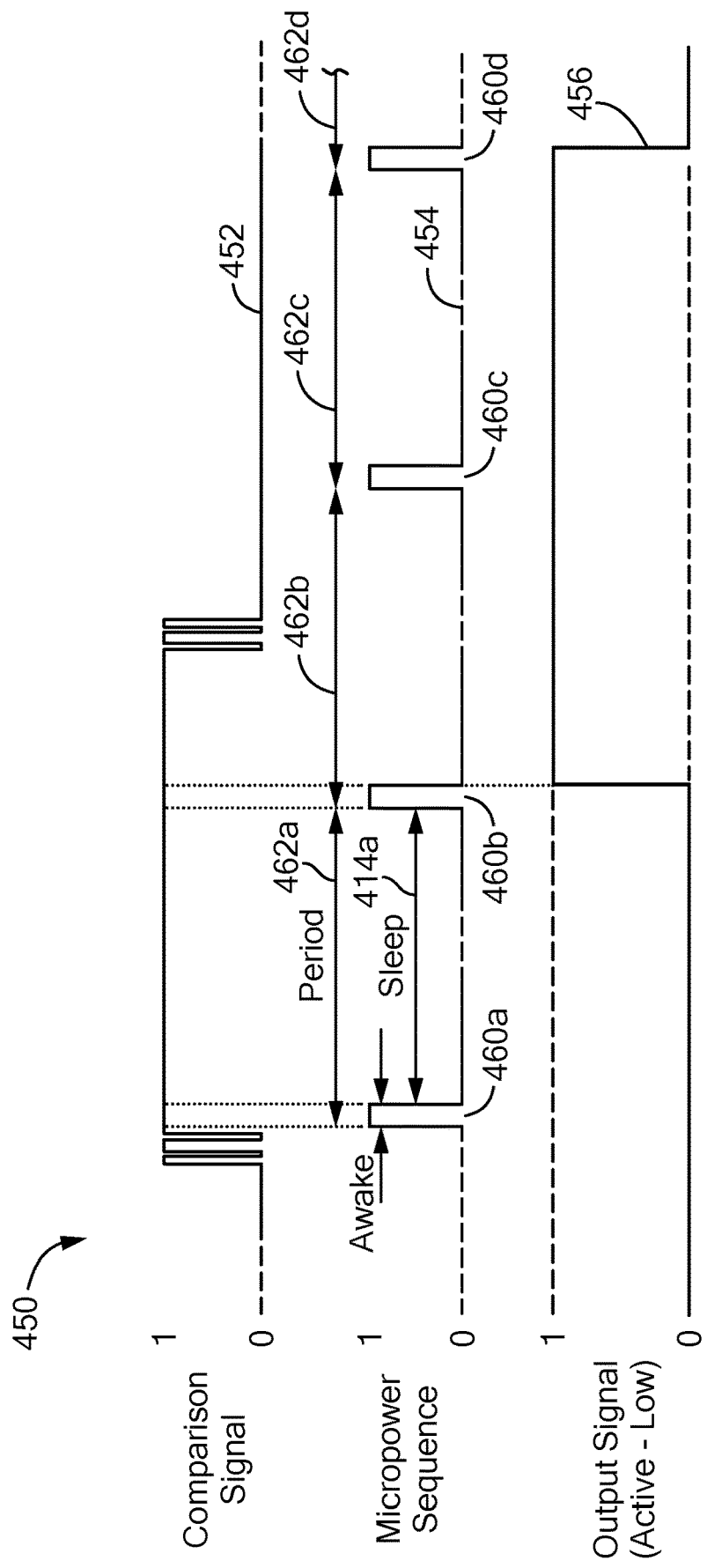
FIG. 4A shows a plot illustrating use of a micropower sequence to implement debounce functionality by illustrating the relationship between an alternative comparison signal, micropower sequence and the corresponding output signal.

Now referring to FIG. 4A, a plot 450 illustrating a use of a micropower sequence to implement debounce functionality is provided showing the relationship between another example comparison signal 452, micropower sequence 454 and the corresponding output signal 456 of a sensor. Plot 450 is different from plot 400 of FIG. 4, as comparison signal 452 maintains its level for two successive periods.

In the illustrative embodiment of FIG. 4A, the comparison signal 452 transitions from a first level (0) to a second level (1) prior to a first period 462a of micropower sequence 454, thus during a first awake portion 460a, the comparison signal 452 is detected at the second level. During the second awake portion 460b, the comparison signal is detected again at the second level, thus the comparison signal 452 has maintained its level for two successive periods, here the first and second periods 462a, 462b of micropower sequence 454. In response to the comparison signal 452 having maintained its level for two successive periods, the output signal 456 transitions from a first level (0) to a second level (1). The change in the level of the output signal 456 can indicate an activation of a switch, such as but not limited to, the opening or closing of the respective switch. The comparison signal 452 transitions from the second level (1) to the first level (0) between wake portions 460b and 460c and the comparison signal 452 maintains the first level until after wake portion 460d. During wake portion 460d the comparison signal has maintained its level for two successive periods, so the output signal 456 transitions from a second level (1) to a first level (0).

In the illustrative embodiment of FIG. 4A, the output signal 456 is initially at the first level (0), however, it should be appreciated that the output signal 456 may be at either the first or second level and transition between the first and second levels in response to the comparison signal 452 having maintained its level for two successive periods. In other embodiments other numbers of micropower periods may be used for debounce, such as 3, 4, 5, etc.

Figure 5:
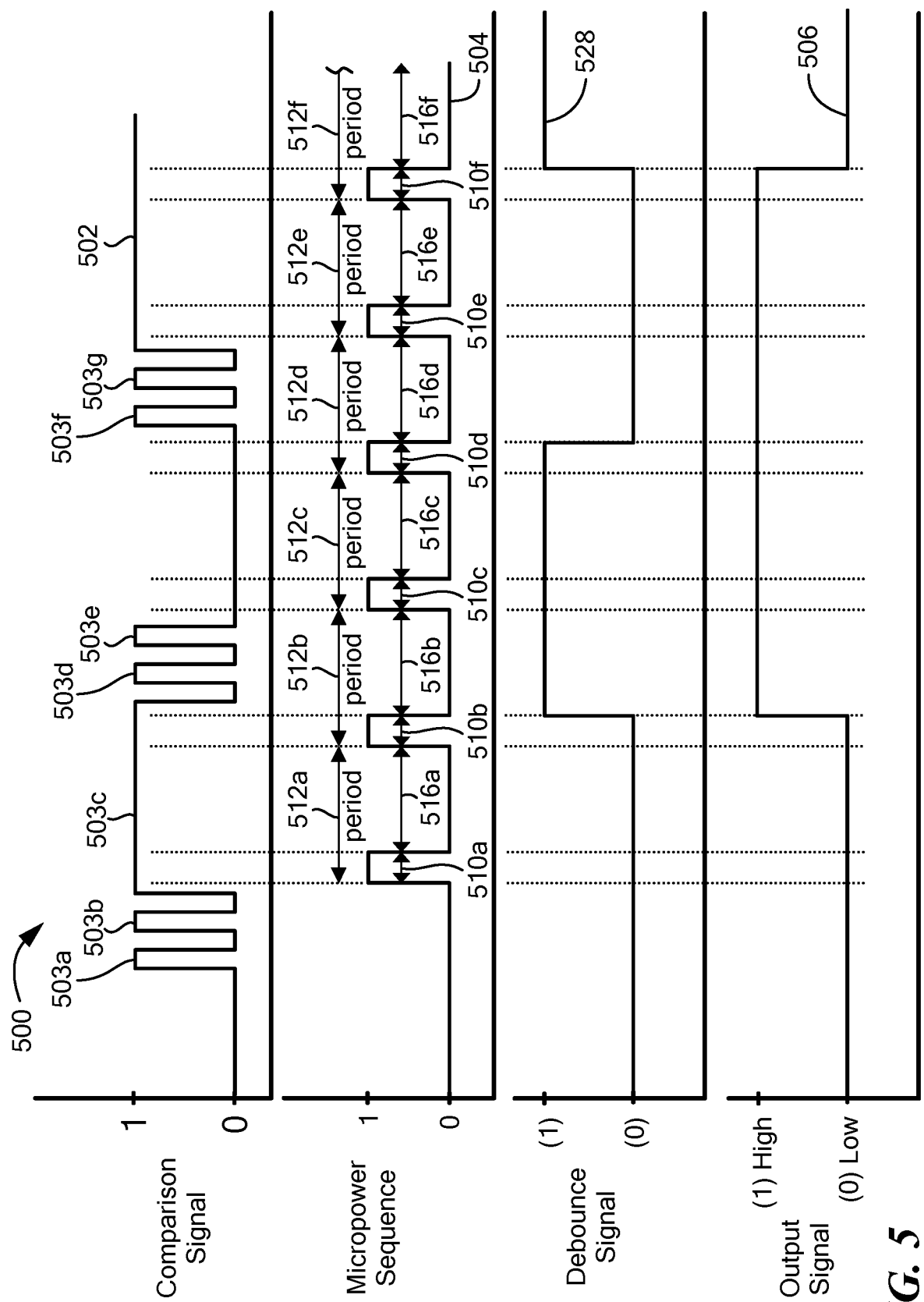
FIG. 5 shows a plot illustrating use of a micropower sequence to implement debounce functionality with toggle functionality.

Now referring to FIG. 5, a plot 500 illustrating a use of a micropower sequence to implement debounce functionality with toggle functionality is provided showing the relationship between an example comparison signal 502, micropower sequence 504, a debounce signal 528 and the corresponding output signal 506 of a sensor. Similar to plots 400 and 450 of FIGS. 4 and 4A, the debounce functionality can be implemented using the micropower sequence 504 by detecting a level of the comparison signal 502 at different periods. The debounce signal 528 changes state when the comparison signal has maintained the same state for two successive micropower time periods, similar to the example of FIG. 4A. However, different from plots 400 and 450 of FIGS. 4 and 4A, the toggle functionality of output signal 506 is enabled, therefore the output signal 506 transitions only on the rising edges of the debounce signal 528 when its level changes from a first state (0, or low) to a second state (1, or high), instead of only when the comparison signal 502 maintains its level at a predetermined level (e.g., the second level) for two successive awake periods as illustrated in plots 400 and 450 of FIGS. 4 and 4A. In other embodiments the output signal 506 could be set to transition only on the falling edges of the debounces signal.

For example, the comparison signal 502 may transition between a first level (0) and a second level (1) several times, including times 503a-503g. The micropower sequence 504 includes multiple periods 512a-512f, each having awake portions 510a-510f and sleep portions 516a-516f. In the illustrative embodiment of FIG. 5, during the first awake portion 510a, the comparison signal 502 is detected at the second level, or the 1 or high level. The debounce signal 528 maintains its state at the first level, 0 or low level, since the comparison signal 502 has only been high for one awake cycle. During the second awake portion 510b, the comparison signal 502 is detected at the second level again. Thus, the comparison signal 502 has maintained its level for two consecutive awake portions during the first and second periods 512a, 512b. In response to the comparison signal 502 maintaining its level for two awake portions, the debounce signal 528 transitions from the first level (0) to the second level (1). The output signal 506 transitions from the first level, or the low or 0 level, to the second level, or the high or 1 level, in response to the debounce signal 528 changing state from a low to a high level, i.e. debounce signal 528 having a rising edge transition.

During the third awake portion 510c, the comparison signal 502 is detected at the first or low level and the debounce signal 528 and output signal 506 maintain their states or levels. During the fourth awake portion 510d, the comparison signal is again detected at the first or low level. The comparison signal 502 has maintained its level (here the first level) for two consecutive periods. In response to the comparison signal 502 maintaining its level (here the first level) the debounce signal 528 changes state from the second or high level to the first or low level. The output signal 506 maintains its state at a second or high level, since the debounce signal 528 did not make a rising edge transition.

During a fifth awake portion 510e, the comparison signal 502 is detected at the second level, or the 1 or high level. The debounce signal 528 maintains its state at the first level, 0 or low level, since the comparison signal 502 has only been high for one awake cycle. During the sixth awake portion 510f, the comparison signal 502 is detected at the second level again. Thus, the comparison signal 502 has maintained its level for two consecutive awake portions during the fifth and sixth periods 512e, 512f In response to the comparison signal 502 maintaining its level for two awake portions, the debounce signal 528 transitions from the first level (0) to the second level (1). The output signal 506 transitions from the first level, or the low or 0 level, to the second level, or the high or 1 level, in response to the debounce signal 528 changing state from a low to a high level.

In other embodiments the toggle function may occur on a falling edge. In another embodiment the debounce signal may be generated with more than two consecutive clock cycles of the same state, for example 3 to 10 clock cycles. In another embodiment larger numbers of clock cycles may be used, for example up to 100 clock cycles.

With toggle functionality enabled, the output signal 506 (also referred to herein as a toggle signal) transitions between the first and second level every time the debounce signal 528 transitions from the first or low state to the second or high state. This is in contrast to embodiments having toggle functionality disabled (e.g., plots 400 and 450 of FIGS. 4 and 4A), where the output signal transitions between the first and second level in response to the comparison signal maintaining a predetermined level for two successive awake portions, which can correspond to every other time a magnetic field signal crosses a predetermined threshold.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed:
1. A sensor comprising:
  a magnetic field sensing element configured to generate a magnetic field signal in response to a magnetic field indicative of a distance or angle between the magnetic field sensing element and a target;
  a first circuit having an input coupled to receive the magnetic field signal and an output at which is provided a comparison signal indicative of the distance or angle between the magnetic field sensing element and the target;
  a debounce circuit having an input coupled to receive the comparison signal and an output at which is provided a debounced signal indicative of the distance or angle between the magnetic field sensing element and the target, wherein the debounce circuit is configured to debounce the comparison signal; and a switch coupled to the first circuit and configured to selectively couple power to at least a portion of the first circuit for an activation portion of each of a plurality of consecutive time periods.

2. The sensor of claim 1, wherein the magnetic field sensing element, the first circuit, and the debounce circuit are provided in a single integrated circuit.

3. The sensor of claim 1, further comprising a second circuit having an input coupled to receive the debounced signal and an output at which is provided a toggle signal, wherein the second circuit is configured to cause the toggle signal to transition between a first level and a second level every other time the debounced comparison signal crosses a predetermined threshold level.

4. The sensor of claim 3, wherein the predetermined threshold level comprises a first threshold level and a second threshold level.

5. The sensor of claim 1, wherein the target comprises a magnet to generate the magnetic field.

6. The sensor of claim 1, wherein the sensor further comprises a back bias magnet, the target comprises a ferromagnetic element and the magnetic field sensing element is positioned between the back bias magnet and the target.

7. The sensor of claim 1, wherein the first circuit comprises a Schmitt trigger.

8. The sensor of claim 7, wherein the Schmitt trigger comprises a window comparator.

9. The sensor of claim 3, wherein the second circuit comprises a flip-flop.

10. The sensor of claim 1, wherein the debounce circuit comprises a filter.

11. The sensor of claim 3, wherein the magnetic field sensing element, the first and second circuits, and the debounce circuit are provided in a single integrated circuit.

12. The sensor of claim 3, wherein the debounce circuit is configured to cause the toggle signal to transition when the comparison signal is at the same level for a predetermined number of activation portions of consecutive time periods.

13. A sensor comprising:
a magnetic field sensing element configured to generate a magnetic field signal in response to a magnetic field indicative of a distance or angle between the magnetic field sensing element and a target;
a first circuit having an input coupled to receive the magnetic field signal and an output at which is provided a comparison signal indicative of the distance or angle between the magnetic field sensing element and the target, wherein the first circuit is configured to cause the comparison signal to transition from a first level to a second level when the magnetic field signal crosses a predetermined threshold level;
a switch coupled to the first circuit and configured to selectively activate at least a portion of the first circuit for an activation portion of each of a plurality of consecutive time periods; and a debounce circuit responsive to the comparison signal to generate an output signal, wherein the debounce circuit is configured to cause the output signal to transition when the comparison signal is at the same level for a predetermined number of activation portions of consecutive time periods.

14. The sensor of claim 13, further comprising a second circuit responsive to the comparison signal and configured to generate a toggle signal to transition from a first level to a second level every other time the debounced comparison signal crosses the predetermined threshold level, wherein the debounce circuit is responsive to the comparison signal to generate the output signal.

15. The sensor of claim 14, wherein the magnetic field sensing element, the first circuit, the second circuit, the switch and the debounce circuit are provided in a single integrated circuit.

16. The sensor of claim 13, wherein the target comprises a magnet to generate the magnetic field.

17. The sensor of claim 13, wherein the sensor further comprises a back bias magnet, the target comprises a ferromagnetic element and the magnetic field sensing element is positioned between the back bias magnet and the target.

18. The sensor of claim 13, wherein the predetermined threshold level comprises an first threshold level and a second threshold level.

19. A sensor comprising:
means for generating a magnetic field signal in response to a magnetic field indicative of a distance or angle between the magnetic field signal generating means and a target;
means coupled to the magnetic field signal generating means for generating a comparison signal that transitions every time the magnetic field signal crosses a predetermined threshold level;
debouncing means coupled to the comparison signal generating means for generating a debounced signal indicative of the distance or angle between the magnetic field signal generating and the target; and
switching means coupled to the comparison signal generating means and configured to selectively couple power to the comparison signal generating means for an activation portion of each of a plurality of consecutive time periods.

20. The sensor of claim 19, further comprising means coupled to the debouncing means for generating a toggle signal, wherein the toggle signal generating means is configured to cause the toggle signal to transition from a first level to a second level every other time the debounced comparison signal crosses the predetermined threshold level.

21. The sensor of claim 19, wherein the debouncing means is configured to generate the debounced signal that transitions when the comparison signal is at the same level for a predetermined number of activation portions of consecutive time periods.

* * * * *

UNITED STATES PATENT AND TRADEMARK OFFICE
CERTIFICATE OF CORRECTION

PATENT NO. : 11,152,938 B2
APPLICATION NO. : 16/398739
DATED : October 19, 2021
INVENTOR(S) : Joseph James Judkins, III et al.

It is certified that error appears in the above-identified patent and that said Letters Patent is hereby corrected as shown below:

In the Specification

Column 1, Line 64 delete "to a planar" and replace with --to planar--.

Column 5, Lines 41-42 delete "element 102" and replace with --element 104--.

Column 6, Line 19 delete "(CVH)." and replace with --(CVH) effect elements.--.

Column 9, Line 57 delete "FIG. 2A," and replace with --FIG. 2A)--.

Column 9, Line 64 delete "of this" and replace with --this--.

Column 10, Line 5 delete "signals 334a" and replace with --signal 334a--.

Column 10, Line 7 delete "signals 334b" and replace with --signal 334b--.

Column 10, Line 44 delete ", Latch" and replace with --, latch--.

Column 12, Line 13 delete "transitions" and replace with --transition--.

Column 13, Line 42 delete "debounces" and replace with --debounce--.

In the Claims

Column 16, Line 25 delete "an first" and replace with --a first--.

Column 16, Line 39 delete "generating and" and replace with --generating means and--.

Signed and Sealed this
Twenty-fifth Day of October, 2022

*Katherine Kelly Vidal*

Katherine Kelly Vidal
*Director of the United States Patent and Trademark Office*